United States Patent
Lee et al.

(10) Patent No.: US 10,438,824 B2
(45) Date of Patent: Oct. 8, 2019

(54) APPARATUS FOR TRANSFERRING THIN-FILM ELEMENTS

(71) Applicant: GWANGJU INSTITUTE OF SCIENCE AND TECHNOLOGY, Gwangju (KR)

(72) Inventors: Jongho Lee, Gwangju (KR); Sungbum Cho, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 56 days.

(21) Appl. No.: 15/662,262

(22) Filed: Jul. 27, 2017

(65) Prior Publication Data

US 2018/0061686 A1 Mar. 1, 2018

(30) Foreign Application Priority Data

Aug. 24, 2016 (KR) .................. 10-2016-0107490

(51) Int. Cl.
*H01L 21/67* (2006.01)
*H01L 27/12* (2006.01)
*B65H 37/04* (2006.01)

(52) U.S. Cl.
CPC ....... *H01L 21/67121* (2013.01); *B65H 37/04* (2013.01); *H01L 21/67132* (2013.01);
(Continued)

(58) Field of Classification Search
CPC ...... B65H 2404/1521; B65H 2701/194; B65H 37/04; H01L 21/67132; H01L 27/1259; H01L 21/67121; Y10T 29/49829
(Continued)

(56) References Cited

U.S. PATENT DOCUMENTS 7,509,074 B2 * 3/2009 Yokoyama ......... G03G 15/1625
399/162
8,794,150 B2 * 8/2014 Theis ..................... B41F 17/00
101/216
(Continued)

FOREIGN PATENT DOCUMENTS

KR 19970019166 A 5/1997
KR 20030070746 A * 9/2003
(Continued)

OTHER PUBLICATIONS

Park, Mun Bae; Electrostatic and pressure transfer mode printer; Feb. 2, 2019; EPO English Machine Translation; pp. 1-4.*
(Continued)

*Primary Examiner* — Bayan Salone
(74) *Attorney, Agent, or Firm* — Loza & Loza, LLP; Heidi L. Eisenhut (57) ABSTRACT

There is an apparatus for transferring a thin-film element, the apparatus comprising: a belt-type stamp; at least one support roller configured to allow a movement of the stamp; a first-stage roller system including at least one first-stage roller, wherein the first-stage roller is configured to allow thin-film elements attached to a first substrate to be picked up from the first substrate and to be attached to the stamp, wherein; and a second-stage roller configured to allow the thin-film elements attached to the stamp to be picked up from the stamp and to be printed onto a second substrate, wherein a curvature radius of the first-stage roller and a curvature radius of the second-stage roller are different from each other.

11 Claims, 12 Drawing Sheets

(52) U.S. Cl.
CPC .. *H01L 27/1259* (2013.01); *B65H 2404/1521* (2013.01); *B65H 2701/194* (2013.01); *Y10T 29/49829* (2015.01)

(58) Field of Classification Search
USPC ....... 101/212, 216, 217, 335, 348, 363, 368, 101/375, 327, 483; 156/1, 60, 230, 241, 156/64, 269, 250; 136/243, 244, 249, 136/258; 425/405.1; 106/438, 428, 430, 106/444, 445, 447; 257/E31.001, 257/E31.002, E31.04, E31.041, E31.042; 438/61, 62
See application file for complete search history.

(56) References Cited

U.S. PATENT DOCUMENTS

| | | | |
|---|---|---|---|
| 8,893,619 | B2 | 11/2014 | Muraoka |
| 9,281,230 | B2 | 3/2016 | Kim et al. |
| 2006/0280912 | A1* | 12/2006 | Liang ........................ H01B 1/22 428/173 |
| 2012/0069488 | A1* | 3/2012 | Bulovic ................ B81C 1/0046 361/311 |
| 2012/0118506 | A1* | 5/2012 | Kim .................... H01L 21/6836 156/367 |
| 2014/0102327 | A1* | 4/2014 | Theis ...................... B41F 17/00 101/253 |
| 2016/0089872 | A1* | 3/2016 | Jang ........................ B65H 20/02 101/492 |
| 2017/0255133 | A1* | 9/2017 | Kubota .............. G03G 15/1605 |

FOREIGN PATENT DOCUMENTS

| | | |
|---|---|---|
| KR | 20030070746 A | 9/2003 |
| KR | 2010-0037476 A | 4/2010 |
| KR | 20100071440 A | 6/2010 |
| KR | 100969998 B1 | 7/2010 |
| WO | 2006027963 A1 | 5/2008 |

OTHER PUBLICATIONS

Cho et al. "Adhesiveless transfer printing of ultrathin microscale semiconductor materials by controlling the bending radius of an elastomeric stamp" Am. Chem. Soc., Langmuir 2016 32(31): 7951-7957 (Jul. 26, 2016).

* cited by examiner

APPARATUS FOR TRANSFERRING THIN-FILM ELEMENTS

CROSS-REFERENCE TO RELATED APPLICATIONS

This application claims the benefit of Korean Patent Application No. 10-2016-0107490, filed on Aug. 24, 2016 entitled "TRANSFER PRINTING DEVICE", which is hereby incorporated by reference in its entirety into this application.

BACKGROUND

Field of the Present Disclosure

The present invention relates to an apparatus for transferring a thin-film element. More particularly, the present invention relates to an apparatus for transferring a thin-film element without using an adhesive.

Discussion of Related Art

Recent studies have shown that electronic devices such as displays, solar cells, curved electronic devices, biomedical devices, and transparent electrodes, etc. may be implemented in a form that can be bent or unfolded. One way to implement such bent or unfolded devices is to transfer a micro semiconductor device using non-generic materials.

Generally, the micro semiconductor device is picked up from a hard wafer using a stamp, and the picked-up semiconductor device is printed on a target substrate using a liquid adhesive. Thus, it is convenient to transfer the micro semiconductor device by using the sticky liquid adhesive. However, in this approach, there are limitations associated with high processing temperatures and thermal or electrical resistances between the micro semiconductor device and the substrate. As a result, a method of slowly transferring the micro semiconductor device using an elastomeric stamp, a method of transferring the micro semiconductor device using a microstructural stamp without the adhesive, and the like have been studied.

However, an apparatus for transferring a thin-film element with a faster transfer speed and a more simple transfer process is required.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide an apparatus for transferring thin-film elements without using an adhesive.

Further, the present disclosure is to provide an apparatus for transferring thin-film elements with a faster transfer speed and a more simple transfer process.

Furthermore, the present disclosure is to provide an apparatus for transferring thin-film elements by adjusting a radius of curvature of a stamp.

Furthermore, the present disclosure is to provide a method for transferring thin-film elements by adjusting a radius of curvature of a stamp.

In one aspect of the present disclosure, there is provided an apparatus for transferring a thin-film element, the apparatus comprising: a belt-type stamp; at least one support roller configured to allow a movement of the stamp; a first-stage roller system including at least one first-stage roller, wherein the first-stage roller is configured to allow thin-film elements attached to a first substrate to be picked up from the first substrate and to be attached to the stamp, wherein; and a second-stage roller configured to allow the thin-film elements attached to the stamp to be picked up from the stamp and to be printed onto a second substrate, wherein a curvature radius of the first-stage roller and a curvature radius of the second-stage roller are different from each other.

In one implementation, during the movement of the stamp, an area of the stamp having the thin-film elements attached thereto moves from the first-stage roller to the second-stage roller.

In one implementation, the first-stage roller system includes a plurality of first-stage rollers with different curvature radii, wherein the first-stage roller system is configured to select one first-stage roller among a plurality of first-stage rollers such that the selected roller allows the thin-films to be picked up from the first substrate and to be attached to the stamp.

In one implementation, the first-stage roller system further comprises a stepper motor configured to allow the plurality of the first-stage rollers to be rotated collectively by a predetermined angle.

In one implementation, the apparatus further comprises an elongate guide coupled to the first-stage roller; and a spring disposed along the guide to allow close contact between the first-stage roller and the stamp.

In one implementation, the predetermined angle is 120 degrees.

In one implementation, the selected roller is selected based on sizes of the thin-film element to be picked up from the first substrate.

In one implementation, the apparatus further comprises a first conveyor configured to displace the first substrate toward the first-stage roller; and a second conveyor configured to displace the second substrate toward the second-stage roller.

In one implementation, the apparatus further comprises a first spring configured to allow close contact between the first conveyor and the stamp; and/or a second spring configured to allow close contact between the second conveyor and the stamp.

In one implementation, the curvature radius of the first-stage roller is larger than the curvature radius of the second-stage roller.

In another aspect of the present disclosure, there is provided a method for transferring thin-film elements from a first substrate to a second substrate, the method comprising: providing an apparatus for transferring thin-film elements, wherein the apparatus comprises a belt-type stamp, a first-stage roller and a second-stage roller, wherein the belt-type stamp is configured to move along the first-stage roller and the second-stage roller; moving the stamp; the first-stage roller pressure-contacting the stamp against the first substrate having the thin-film elements attached thereto, thereby to allow the thin-film elements to be picked up from the first substrate and to be attached to the stamp; and the second-stage roller pressure-contacting the stamp against the second substrate such that the thin-film elements attached to the stamp are picked up from the stamp and are printed onto the second substrate, wherein a curvature radius of the first-stage roller and a curvature radius of the second-stage roller are different from each other.

In accordance with the present disclosure, the thin-film elements may be transferred without using an adhesive.

In accordance with the present disclosure, the thin-film elements may be transferred with a faster transfer speed and a more simple transfer process.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

FIGS. 1a, 1b, 2a and 2b are a method for transferring a thin-film element not using an adhesive but using a stamp according to an embodiment of the present invention.

Figure 1A:
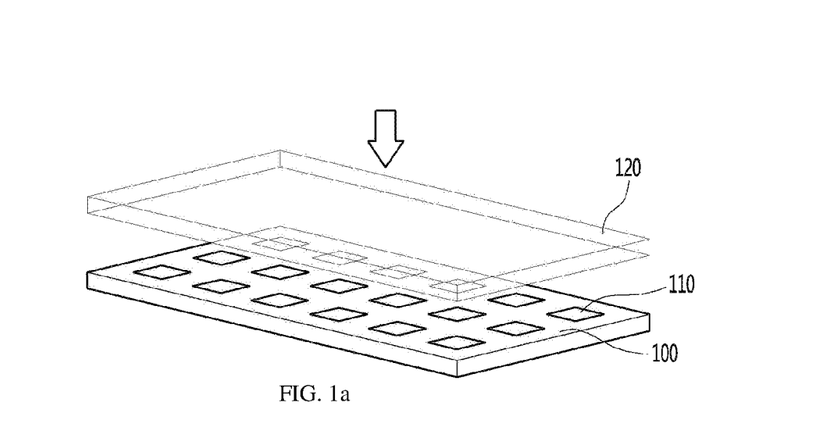
FIGS. 1a and 1b are views illustrating a method for picking up a thin-film element not using an adhesive but using a stamp according to an embodiment of the present invention.
Figure 1B:
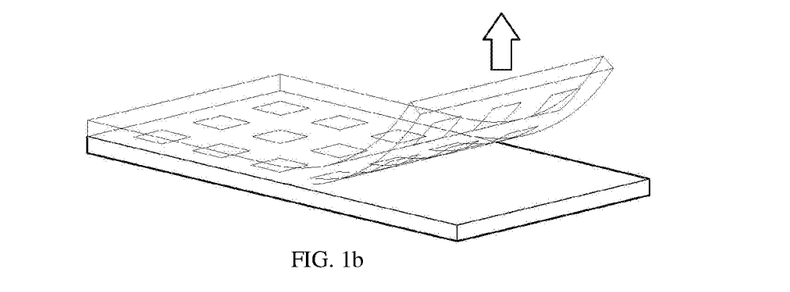

First, FIGS. 1a and 1b are views illustrating a method for picking up a thin-film element not using an adhesive but using a stamp according to an embodiment of the present invention.

As shown in FIG. 1a, thin-film elements 110 may be disposed on an original substrate 100. A stamp 120 may then be contacted with the original substrate 100 on which the thin-film elements 110 lie. The thin-film element 110 may be a micro Si plate. Specifically, the thin-film elements may be embodied an array of the micro-silicon plates uniformly arranged on the substrate. However, this is merely exemplary.

The stamp 120 may be a PDMS (Polydimethylsiloxane) stamp. The PDMS stamp has a small change in a vicious face area due to temperature, excellent electrical insulation, small surface tension, and excellent chemical stability. However, the PDMS stamp is merely illustrative. The present invention is not limited thereto.

As shown in FIG. 1a, the stamp 120 press-contacts the original substrate 100 on which the thin-film elements 110 are located, such that the thin-film elements 110 contact the stamp 120. Then, the stamp 120 may be separated from the original substrate 100, as shown in FIG. 1b. At this time, the thin-film elements 110 are separated from the original substrate 100 along with the stamp 120, whereby the thin-film elements 110 may be disposed on the stamp 120.

According to an embodiment of the present invention, in order to separate all of the thin-film elements 110 from the original substrate 100, the stamp 120 may be flexible. That is, the stamp 120 may be a flexible elastomeric stamp. Specifically, in the pick-up process as shown in FIGS. 1a and 1b, the stamp 120 may be a flexible elastomeric stamp having a relatively large curvature radius. The larger the curvature radius of the stamp 120, the better the separation of the thin-film elements 110 from the original substrate 100. The effect of the curvature radius on the pick-up process will be described in detail in FIGS. 3a and 3b.

Figure 2A:
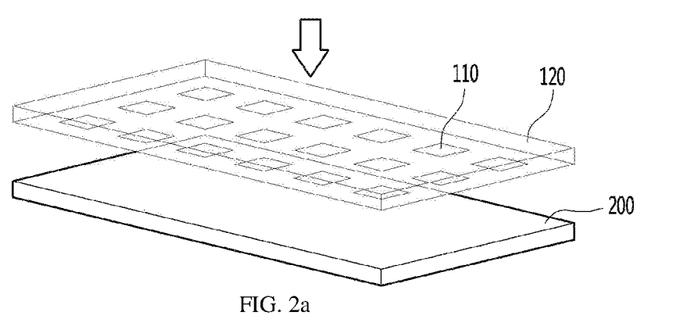
FIGS. 2a and 2b are views for illustrating a method for printing a thin-film element not using an adhesive but using a stamp according to an embodiment of the present invention.
Figure 2B:
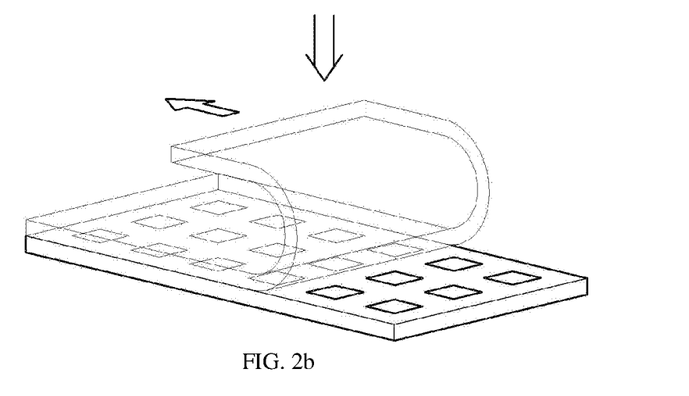

Next, FIGS. 2a and 2b are views illustrating a method for printing a thin-film element not using an adhesive but using a stamp according to an embodiment of the present invention.

According to an embodiment of the present invention, the stamp 120 having the thin-film elements 110 attached thereto may be contacted with a target substrate 200 without adhesive, as shown in FIG. 2a. In this connection, the stamp 120 may be press-contacted with the target substrate 200.

The stamp 120 may then be separated from the target substrate 200, as shown in FIG. 2b. In this connection, the thin-film elements 110 disposed on the stamp 120 may be separated from the stamp 120 along with the target substrate 200. Accordingly, the thin-film elements 110 are disposed on the target substrate 200. The stamp 120 may be flexible so that the thin-film elements 110 are completely separated from the stamp 120 and, thus, positioned on the target substrate 200. In particular, in the printing process as shown in FIG. 2a, the stamp 120 may be a flexible elastomeric stamp having a relatively small curvature radius. The smaller the curvature radius of the stamp 120, the better the thin-film elements 110 adhere to the target substrate 200. The effect of the curvature radius on the printing process will be described in detail with reference to FIGS. 3a and 3b below.

Figure 3A:
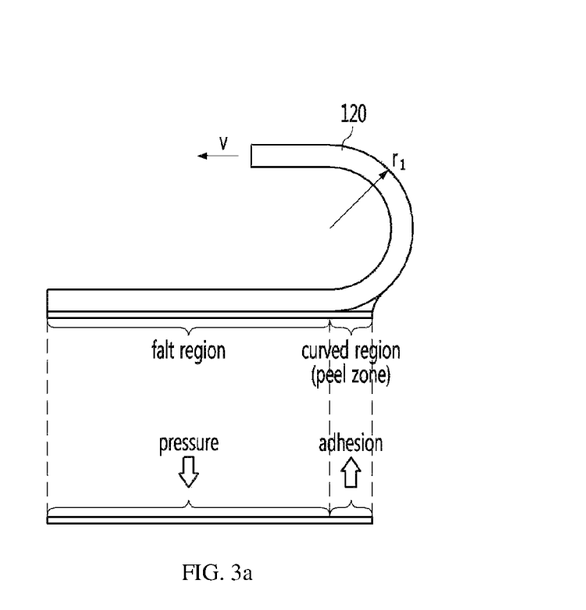
FIGS. 3a and 3b are views for illustrating influence of a curvature radius of a stamp on a transfer process according to the embodiment of the present invention.
Figure 3B:
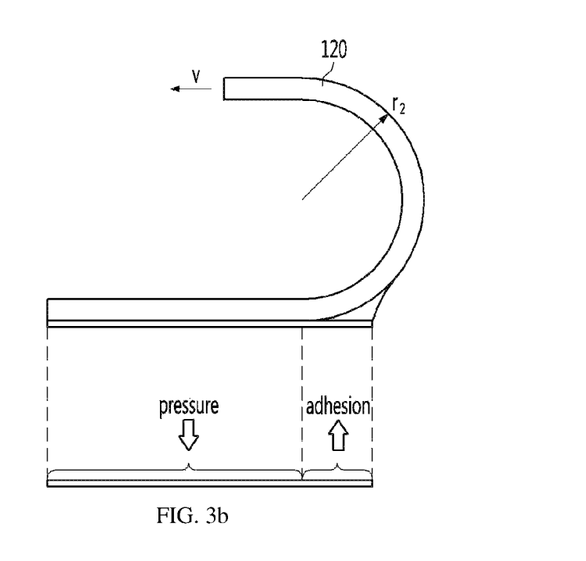

FIGS. 3a and 3b are views illustrating influence of a curvature radius of a stamp on a transfer process according to the embodiment of the present invention. Specifically, FIG. 3a illustrates a case where the curvature radius of the stamp 120 is small. FIG. 3b illustrates a case where the curvature radius of the stamp is large.

The adhering force and pressure are important factors in the pick-up and printing processes between the stamp 120 and the substrates 100 and 200. Referring to FIGS. 3a and 3b, the influence of the curvature radius of the stamp 120 on the adhering force and pressure is described.

According to an embodiment of the present invention, as shown in FIGS. 3a and 3b, the flexible stamp 120 may include both a flat region and a curved region. In this connection, in the flat region, due to the bending force of the stamp 120, a pressure is applied to the substrate. In the curved region, due to the viscosity of the stamp 120, an adhering force is generated between the stamp 120 and the substrate.

As shown in FIG. 3a, when the curvature radius r1 of the stamp 120 is small, the flat region is widened and the curved region is narrowed. Therefore, when the stamp 120 having the small curvature radius is used, in the transfer process, the adhering force is weak and a high pressure is applied to the substrate. On the contrary, as shown in FIG. 3b, when the curvature radius r2 of the stamp 120 is large, the flat region is narrowed and the curved region is widened. Therefore, by using the stamp 120 having the large curvature radius, the adhering force may be increased while applying a low pressure to the substrate during the transfer process.

Figure 4:
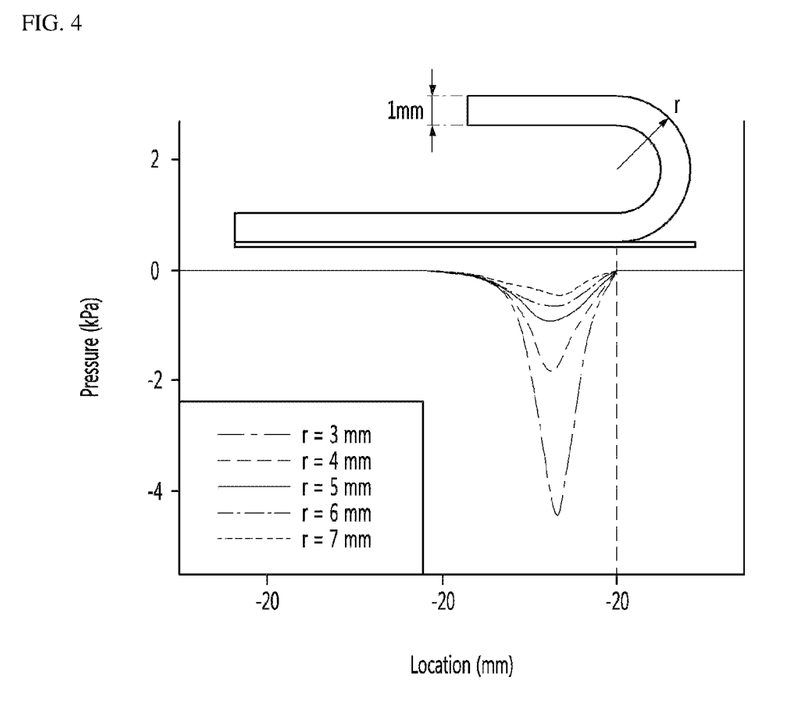
FIG. 4 is a graph illustrating a change in a pressure applied to a substrate based on a curvature radius of a stamp according to an embodiment of the present invention.

FIG. 4 is a graph illustrating a change in a pressure applied to a substrate based on a curvature radius of a stamp according to an embodiment of the present invention.

Assuming that the thickness of the stamp 120 is 1 mm, the pressure from the stamp 120 applied to the substrate may be measured based on the variable curvature radius r of the stamp 120. Specifically, the variable curvature radius r of the stamp 120 may be 3 mm, 4 mm, 5 mm, 6 mm and 7 mm. The graph shown in FIG. 4 shows pressures applied from the stamp 120 toward the substrate when the curvature radius r of the stamp 120 varies between 3 mm, 4 mm, 5 mm, 6 mm, and 7 mm. As can be seen from the graph shown in FIG. 4, the smaller the curvature radius r, the higher the measured pressure. Conversely, the larger the radius r, the lower the measured pressure. Therefore, in the pick-up process, it may be efficient to use the stamp 120 having a large curvature radius.

Figure 5A:
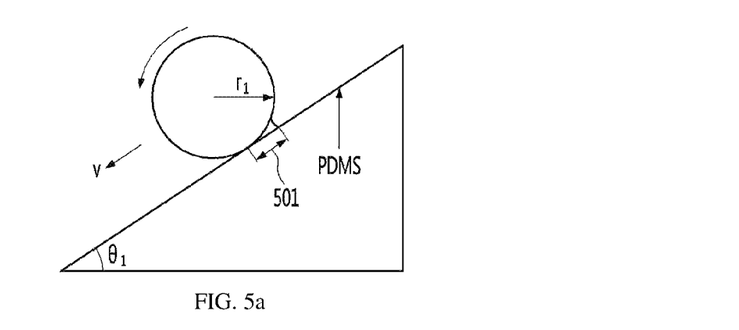
FIGS. 5a and 5b are views for illustrating a change in an adhering force based a curvature radius of a stamp according to an embodiment of the present invention.
Figure 5B:
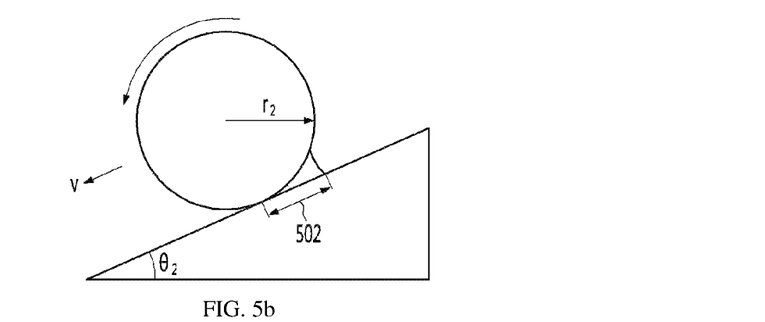

FIGS. 5a and 5b are views illustrating a change in an adhering force based a curvature radius of a stamp according to an embodiment of the present invention.

Specifically, FIG. 5a illustrates a case where the curvature radius r1 of the stamp 120 is small. FIG. 5b illustrates a case where the curvature radius r2 of the stamp 120 is large. Referring to FIGS. 5a and 5b, the curved region 502 is larger when the curvature radius r2 is larger, while the curved region 501 is smaller when the curvature radius r1 is smaller. Thus, the larger the radius of curvature, the higher the adhering force.

In addition, the area size of the curved region affects the energy release rate G. That is, the larger the area of the curved region, the larger the energy release rate. The energy release rate may mean the energy consumed for separation of a given area of the stamp. Thus, it can be seen that the greater the curvature radius of the stamp 120, the higher the adhering force.

Figure 6:
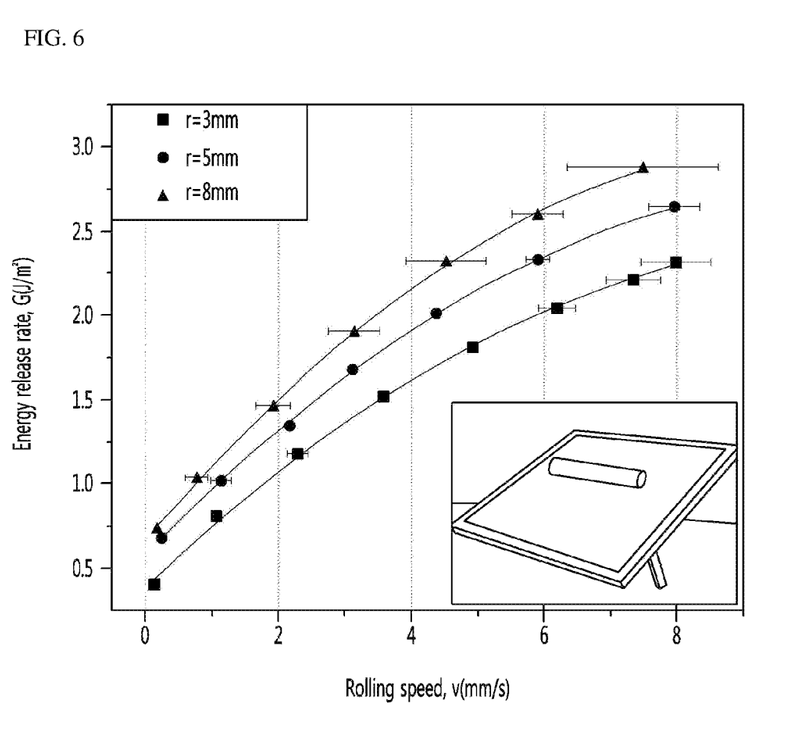
FIG. 6 is a graph showing a change in an adhering force based on a curvature radius of a stamp according to an embodiment of the present invention.

FIG. 6 is a graph showing a change in an adhering force based on a curvature radius of a stamp according to an embodiment of the present invention.

As shown in FIG. 6, the energy release rate G relative to a separation rate v for separating the stamp 120 from the substrate may be measured based on the variable curvature radius r of the stamp 120. Specifically, the variable curvature radius r of the stamp 120 may vary between 3 mm, 5 mm and 8 mm. In this case, the energy release rate G relative to the separation rate v for separating the stamp 120 from the substrate may be measured. Referring to the graph shown in FIG. 6, it can be seen that the larger the radius of curvature r of the stamp 120 is, the higher the energy release rate G is. That is, the greater the curvature radius r of the stamp 120, the stronger the adhering force.

Thus, based on the curvature radius of the stamp 120, the pressure and adhering force may vary. Based on this technical principle of the present invention, the curvature radius of the stamp 120 may be controlled for the apparatus for transferring the thin-film element and the transferring method using the apparatus according to an embodiment of the present invention.

Figure 7:
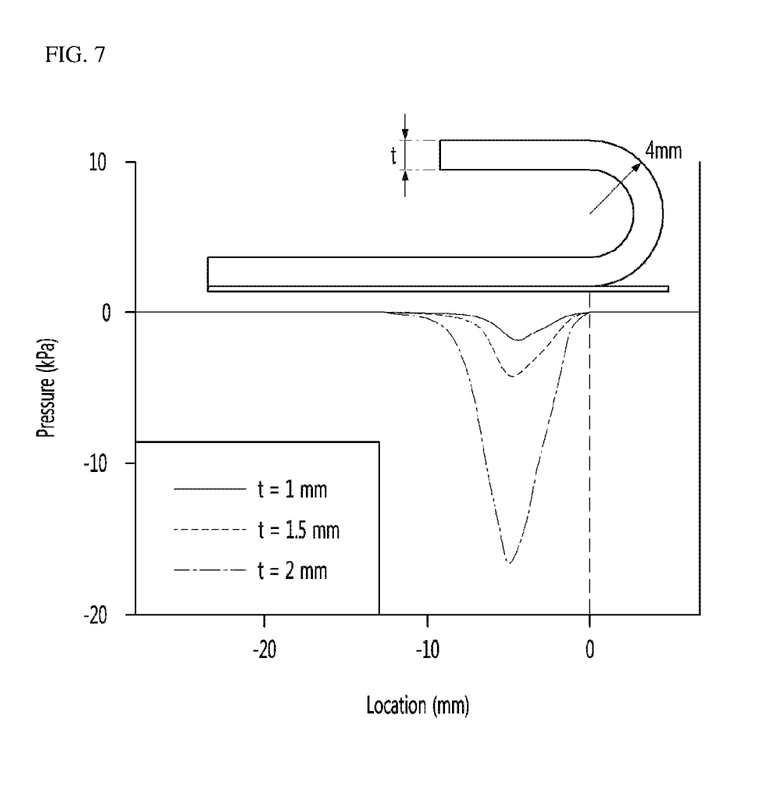
FIG. 7 is a graph for illustrating a change in a pressure based on a thickness of a stamp according to the embodiment of the present invention.

FIG. 7 is a graph for illustrating a change in a pressure based on a thickness of a stamp according to the embodiment of the present invention.

Based on a variable thickness t of the stamp 120, the pressure exerted on the substrate from the stamp 120 may be measured. Specifically, the variable thickness t of the stamp 120 may vary between 1 mm, 1.5 mm and 2 mm. In this case, the pressure applied from the stamp 120 to the substrate may be measured. The measurement results are shown in FIG. 7. Referring to the graph shown in FIG. 7, the greater the thickness t of the stamp 120, the higher the pressure applied from the stamp 120 to the substrate.

Figure 8:
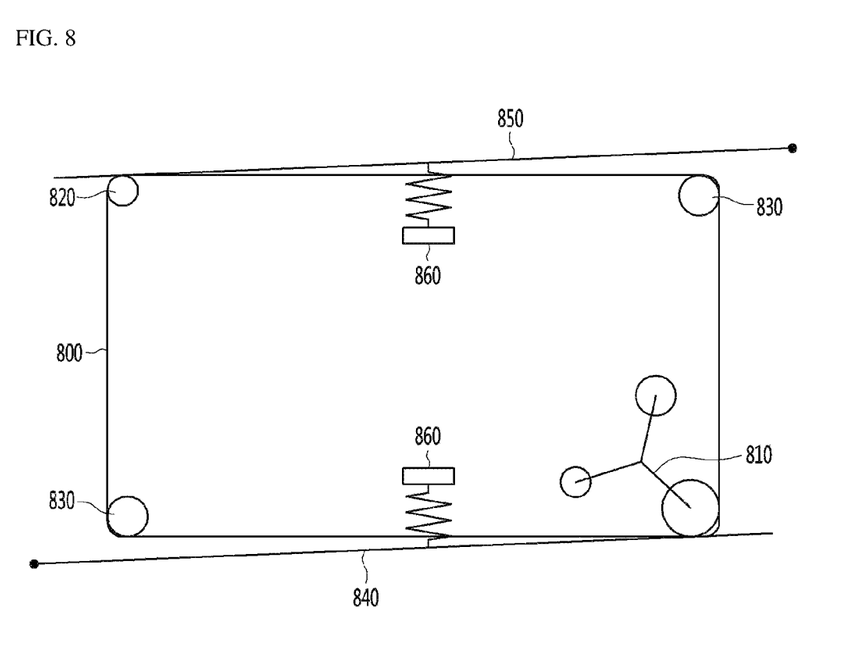
FIG. 8 is a view for illustrating components of an apparatus for transferring a thin-film element according to an embodiment of the present invention.

Next, referring to FIG. 8, the apparatus for transferring the thin-film element according to an embodiment of the present invention will be described. FIG. 8 is a view for illustrating components of an apparatus for transferring a thin-film element according to an embodiment of the present invention.

The apparatus for transferring the thin-film element according to an embodiment of the present invention may include a stamp 800, a rotation roller system 810, a printing roller 820, and a plurality of support rollers 830.

Further, the apparatus for transferring a thin-film element according to an embodiment of the present invention may further include a pick-up conveyor 840, a printing conveyor 850, and a spring 860. Hereinafter, each of the above component of the apparatus for transferring a thin-film element according to an embodiment of the present invention will be described in detail.

First, the stamp 800 according to an embodiment of the present invention may be embodied as a belt type, as shown in FIG. 8. Thus, the belt type stamp 800 may move together with the rotation of the support roller 830. Specifically, the stamp 800 may be rotated constantly according to a rotation direction and a rotation speed of the support roller. For example, the stamp 800 may rotate at a preset speed in a counterclockwise direction. In this way, the stamp 800 may be circulated in a sequential contact with the rotation roller system 810 and the printing roller 820.

Figure 9:
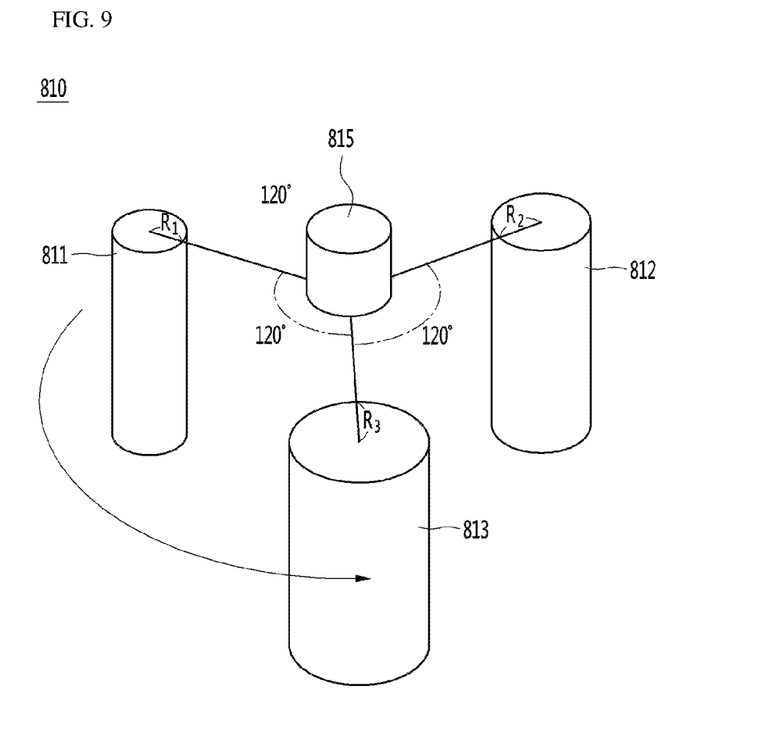
FIG. 9 and FIG. 10 are views for illustrating components of a rotation roller system according to an embodiment of the present invention.
Figure 10:
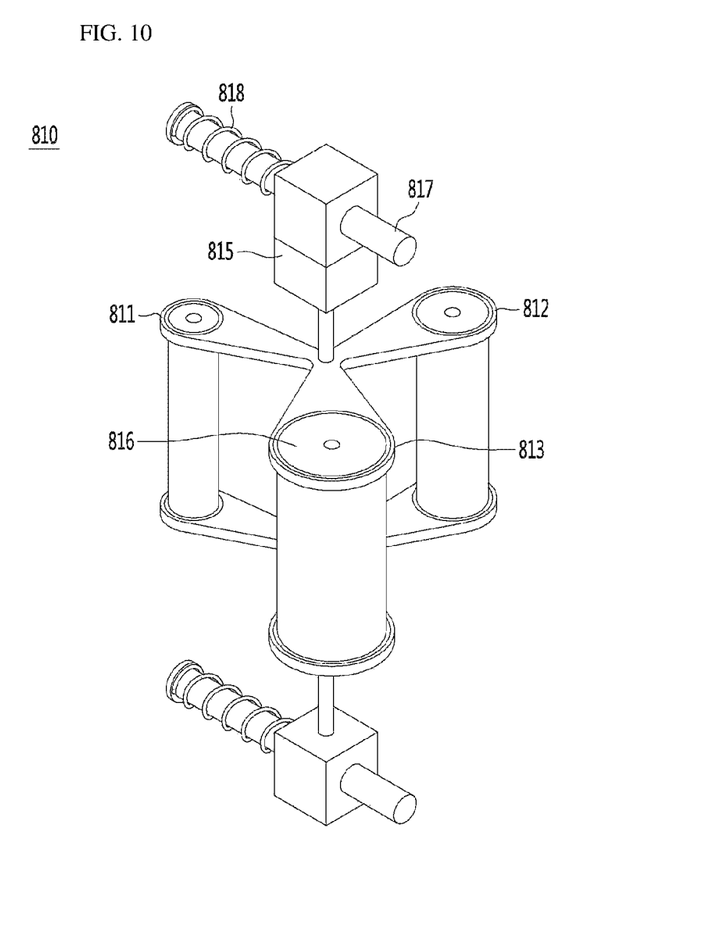

Now, the rotation roller system 810 is described. The rotation roller system 810 according to an embodiment of the present invention will be described in detail with reference to FIGS. 9 to 10. FIG. 10. FIG. 9 and FIG. 10 are views for illustrating components of a rotation roller system according to an embodiment of the present invention.

The rotation roller system 810 according to an embodiment of the present invention includes a first roller 811 having a radius R1, a second roller 812 having a radius R2, a third roller 813 having a radius R3. The roller system 810 further includes a stepper motor 815. The stepper motor 815 is surrounded with the first roller 811, the second roller 812 and the third roller 813 with the equal distance therewith. The stepper motor 815 is operatively coupled to the first roller 811, the second roller 812 and the third roller 813. The first roller 811, the second roller 812, and the third roller 813 are spacedly arranged at an angular spacing of 120 degree with each other. Thus, the rotation roller system 810 comprises the plurality of rollers of different radii. This allows selection of any one of the plurality of rollers to pick up the thin-film elements.

The step motor 815 may be an electric motor step-by-step rotating by a certain angle. The stepped motion count of the stepper motor 815 is proportional to the number of input pulse signals, and the rotational speed of the motor is proportional to the frequency of the input pulse signal. Specifically, when the stepper motor 815 receives a roller change command, the motor may displace the respective rollers by 120 degrees. By displacing the rollers by the stepper motor 815, a certain roller to be used in the pick-up process can be selected. For example, first, the thin-film element 110 is picked up using the third roller 813 with a radius R3. Subsequently, in order to perform the pick-up procedure using the first roller 811 with a radius of R1, the stepper motor 815 may displace the rollers by 120 degrees. In this way, depending on the size of the thin-film element 110, the curvature radius of the stamp 800 can be changed by selecting the appropriate roller. Therefore, the thin-film elements 110 can be efficiently picked up using the belt-type stamp 800.

In the above example, the rotation roller system 810 includes the three different rollers with the different curvature radii. However, the present invention is not limited to this. The rotation roller system 810 may include fewer than three or more than three different rollers with different curvature radii. Accordingly, in the rotation roller system 810, the angular spacing between the rollers may vary. This allows the stepper motor to rotate as much as the angular spacing between the rollers to select the appropriate roller.

Referring to FIG. 10, the detailed components of the rotation roller system 810 according to an embodiment of the present invention will be described.

The rotation roller system 810 according to an embodiment of the present invention may further include bearings 816, guides 817, and springs 818 in addition to the first roller 811, the second roller 812, the third roller 813, and the step motor 815. The respective rollers 811 to 813 and the step motor 815 are the same as those described in FIG. 9.

Each of the bearings 816 is disposed at each of both ends of each of the first to third rollers. Each of the bearings 816 fixes a shaft of the corresponding rotating roller to a fixed position and serves to rotate the shaft while supporting the weight of the shaft and the load applied to the shaft. The bearing 816 also allows the roller to rotate without friction.

When the stepper motor 815 rotates the rollers 811 to 813, each guide 817 and each spring 818 prevents the stamp 800 from being stretched or released from the roller. For this purpose, the guide 817 and the spring 818 allow the roller to be in intimate contact with the stamp 800.

Referring again to FIG. 8, the printing roller 820 shown in FIG. 8 is described.

The printing roller 820 allows the thin-film elements 110 on the stamp 800 to be printed on the target substrate 200. In order to efficiently print the thin-film elements 110 onto the target substrate 200, the printing roller 820 may have a relatively small radius. Specifically, the curvature radius of the printing roller 820 may be less than the curvature radius of the rollers constituting the rotation roller system 810.

Alternatively, in accordance with another embodiment of the present invention, the printing roller 820 may be modified to a printing roller system having different printing rollers with different radii, as in the rotation roller system 810 as illustrated in FIGS. 9 through 10. Accordingly, depending on the size of the thin-film elements 110, one of the printing rollers having different radii may be selected as a corresponding printing roller.

Figure 11:
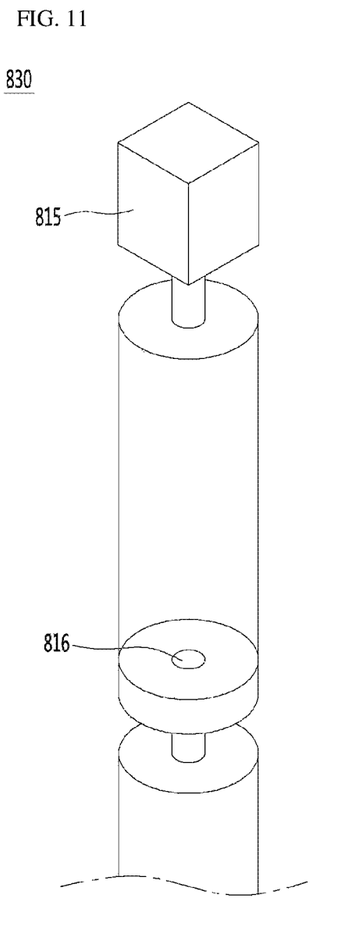
FIG. 11 is a view for illustrating a configuration of a support roller according to an embodiment of the present invention.

Next, the structure of the support roller 830 according to the embodiment of the present invention will be described with reference to FIG. 11. FIG. 11 is a view for illustrating the structure of the support roller according to the embodiment of the present invention.

According to an embodiment of the present invention, the apparatus for transferring a thin-film element may include one or more of the support rollers 830. One support roller 830 includes a further step motor 815 and a further bearing 816. The further stepper motor 815 may be set to rotate counterclockwise at a constant speed. Accordingly, the support roller 830 can rotate the stamp 800 counterclockwise at a constant speed. The rotational speed of the support roller 830 can be determined differently depending on the size and type of the thin-film elements 110, and the like. The bearing 816 causes the support roller 830 to rotate without friction, as described with reference to FIG. 10.

Referring back to FIG. 8, the pick-up conveyor 840 is described.

The pick-up conveyor 840 serves to move the original substrate 100. The pick-up conveyor 840 may move the original substrate 100 toward the rotation roller system 810. Specifically, the thin-film elements 110 are temporarily attached to the original substrate 100 by a photolithography process. Using the pick-up conveyor 840, the original substrate 100 may be contacted with the stamp 800 contacting the rotation roller system 810. When the original substrate 100 contacts the stamp 800 held on the rotation roller system 810, the rotation roller system 810 and the stamp 800 can pressurize the original substrate 100. Accordingly, the thin-film elements 110 on the original substrate 100 are detached from the original substrate 100 and then attached to the stamp 800. The stamp 800 with the attached thin film elements is then moved.

Referring back to FIG. 8, the printing conveyor 850 is described.

The support rollers 830 may displace the area of the stamp 800 having the thin-film elements 110 attached thereto toward the printing roller 820. The printing conveyor 850 can move the target substrate 200 toward the printing roller 820. Specifically, the printing conveyor 850 may move the target substrate 200 such that the target substrate 200 is contacted with the stamp 800 in contact with the printing roller 820. This allows the target substrate 200 to contact the thin-film elements 110 on the stamp 800. In this connection, the printing roller 820 creates a contact force between the thin-film elements 110 attached to the stamp 800 and the target substrate 200. As such, the thin-film elements 110 may be detached from the stamp 800 and attached to the target substrate 200. As described above, the smaller the curvature radius of the printing roller 820, the weaker the adhering force between the thin-film elements 110 and the stamp 800. Therefore, in order to perform such printing more effectively, it is preferable to use a printing roller having a small radius of curvature.

Referring again to FIG. 8, the spring 860 is described.

The apparatus for transferring a thin-film element has a body. The spring 860 may be connected to the body. Each spring 860 presses the pick-up conveyor 840 or the printing conveyor 850 against the stamp 800. Thus, the original substrate 100 or the target substrate 200 moving via the pick-up conveyor 840 or the printing conveyor 850 may be in contact with the rotation roller system 810 or the printing roller 820 respectively.

Figure 12:
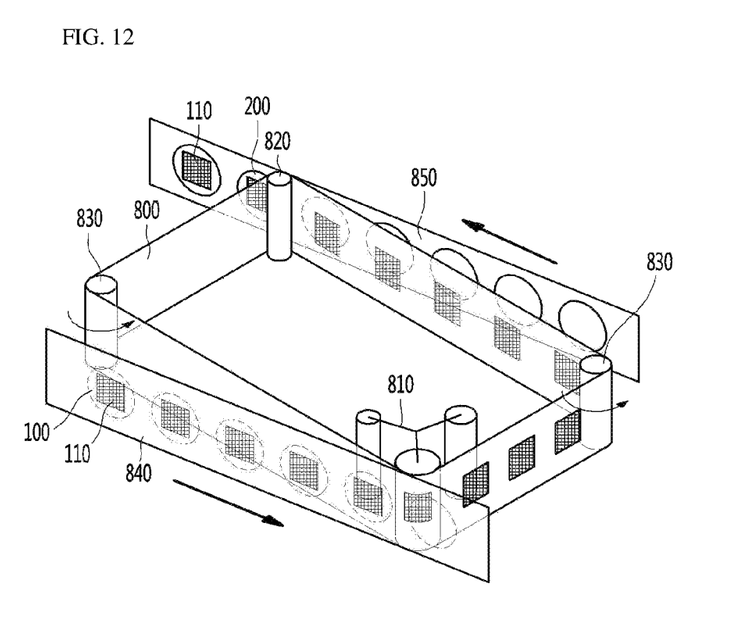
FIG. 12 is a view for illustrating an operation of an apparatus for transferring a thin-film element according to an embodiment of the present invention.

Next, referring to FIG. 12, an operation of the apparatus for transferring a thin-film element according to an embodiment of the present invention will be described in detail. FIG. 12 is a view for an operation of an apparatus for transferring a thin-film element according to an embodiment of the present invention.

First, via the pick-up conveyor 840, the original substrate 100 having the thin-film elements 110 attached thereto may be moved in the direction of the arrow (rightward direction). Then, the original substrate 100 contacts the stamp 800 on the rotation roller system 810. At this time, a strong adhering force is generated between the rotation roller system 810 and the original substrate 100. Thus, the thin-film elements 110 attached to the original substrate 100 are separated from the original substrate 100 and attached to the stamp 800. Thus, the area of the stamp 800 with the thin-film elements 110 is moved toward the printing roller. In this connection, for the pick-up process, a rotation roller having a diameter determined based on the size and material of the thin-film element 110 may be selected from the rotation roller system 810.

The stamp 800 continues to travel at a constant speed by the rotation of the support roller 830. With the movement of the stamp 800, the thin-film elements 110 attached thereto come into contact with the printing conveyor 850. At the same time, the printing conveyor 850 moves the target substrate 200 in the direction of the arrow (leftward). When the thin-film elements 110 traveling along with the stamp 800 contact the stamp 800 on the printing roller 820, a strong pressure is generated between the printing roller 820 and the target substrate 200. Accordingly, the thin-film elements 110 on the stamp 800 are detached from the stamp 800 and attached to the target substrate 200. In this connection, the smaller the curvature radius of the printing roller 820 is, the better the printing process can be performed.

In order to perform the pick-up process and the printing process more efficiently, in the apparatus for transferring a thin-film element according to an embodiment of the present invention, the curvature radius of the rotating roller of the rotation roller system 810 and the curvature radius of the printing roller 820 are set differently. In particular, in the apparatus for transferring a thin-film element according to an embodiment of the present invention, the curvature radius of the rotation roller of the rotation roller system 810 is set to be larger than the curvature radius of the printing roller 820.

According to an embodiment of the present invention, the above-mentioned method can be embodied as processor readable codes on a non-transitory processor readable recording medium having a program thereon. Examples of the processor readable recording medium include ROM, RAM, CD-ROM, magnetic tape, floppy disk, and an optical data storage device and also include carrier waves e.g., transmission through the Internet.

The above-described transfer printing device is not limited to the application of the configurations and methods of the above-described embodiments and the entire or part of the embodiments can be selectively combined and configured to allow various modifications.

What is claimed is:

1. An apparatus for transferring a thin-film element, the apparatus comprising:
   a belt-type stamp;
   at least one support roller configured to allow a movement of the stamp;
   a first-stage roller system including at least one first-stage roller, wherein the first-stage roller is configured to allow thin-film elements attached to a first substrate to be picked up from the first substrate and to be attached to the stamp; and
   a second-stage roller configured to allow the thin-film elements attached to the stamp to be picked up from the stamp and to be printed onto a second substrate,
   wherein a curvature radius of the first-stage roller and a curvature radius of the second-stage roller are different from each other; and
   wherein the first-stage roller system includes a plurality of first-stage rollers with different curvature radius.

2. The apparatus of claim 1, wherein during the movement of the stamp, an area of the stamp having the thin-film elements attached thereto moves from the first-stage roller to the second-stage roller.

3. The apparatus of claim 1,
   wherein the first-stage roller system is configured to select one first-stage roller among a plurality of first-stage rollers such that the selected roller allows the thin-films to be picked up from the first substrate and to be attached to the stamp.

4. The apparatus of claim 3, wherein the first-stage roller system further comprises a stepper motor configured to allow the plurality of the first-stage rollers to be rotated collectively by a predetermined angle.

5. The apparatus of claim 4, wherein the first-stage roller system further comprises an elongate guide coupled to the first-stage roller and a spring disposed along the guide to allow close contact between the first-stage roller and the stamp.

6. The apparatus of claim 4, wherein the predetermined angle is 120 degrees.

7. The apparatus of claim 3, wherein the selected roller is selected based on sizes of the thin-film element to be picked up from the first substrate.

8. The apparatus of claim 1, further comprising:
a first conveyor configured to displace the first substrate toward the first-stage roller; and
a second conveyor configured to displace the second substrate toward the second-stage roller.

9. The apparatus of claim 8, further comprising:
a first spring configured to allow close contact between the first conveyor and the stamp; and
a second spring configured to allow close contact between the second conveyor and the stamp.

10. The apparatus of claim 1, wherein the curvature radius of the first-stage roller is larger than the curvature radius of the second-stage roller.

11. A method for transferring thin-film elements from a first substrate to a second substrate, the method comprising:
providing an apparatus for transferring thin-film elements, wherein the apparatus comprises a belt-type stamp, a first-stage roller and a second-stage roller, wherein the belt-type stamp is configured to move along the first-stage roller and the second-stage roller;
moving the stamp;
the first-stage roller pressure-contacting the stamp against the first substrate having the thin-film elements attached thereto, thereby to allow the thin-film elements to be picked up from the first substrate and to be attached to the stamp; and
the second-stage roller pressure-contacting the stamp against the second substrate such that the thin-film elements attached to the stamp are picked up from the stamp and are printed onto the second substrate,
wherein a curvature radius of the first-stage roller and a curvature radius of the second-stage roller are different from each other,
wherein the curvature radius of the first-stage roller is larger than the curvature radius of the second-stage roller.

* * * * *